United States Patent
Witters et al.

(10) Patent No.: US 10,714,595 B2
(45) Date of Patent: Jul. 14, 2020

(54) METHOD OF FORMING A SEMICONDUCTOR DEVICE COMPRISING AT LEAST ONE GERMANIUM NANOWIRE

(71) Applicant: IMEC VZW, Leuven (BE)

(72) Inventors: Liesbeth Witters, Lubbeek (BE); Kurt Wostyn, Lubbeek (BE)

(73) Assignee: IMEC VZW, Leuven (BE)

( * ) Notice: Subject to any disclaimer, the term of this patent is extended or adjusted under 35 U.S.C. 154(b) by 148 days.

(21) Appl. No.: 16/025,048

(22) Filed: Jul. 2, 2018

(65) Prior Publication Data

US 2019/0013395 A1 Jan. 10, 2019

(30) Foreign Application Priority Data

Jul. 4, 2017 (EP) .................................... 17179667

(51) Int. Cl.
*H01L 21/02* (2006.01)
*H01L 21/28* (2006.01)
(Continued)

(52) U.S. Cl.
CPC .. *H01L 29/66742* (2013.01); *H01L 21/02164* (2013.01); *H01L 21/02236* (2013.01); *H01L 21/02532* (2013.01); *H01L 21/02603* (2013.01); *H01L 21/28255* (2013.01); *H01L 21/31111* (2013.01); *H01L 29/0653* (2013.01); *H01L 29/0673* (2013.01); *H01L 29/42392* (2013.01); *H01L 29/66439* (2013.01); *H01L 29/775* (2013.01); *H01L 29/78684* (2013.01); *H01L 29/78696* (2013.01)

(58) Field of Classification Search
CPC ......... H01L 29/66742; H01L 21/02164; H01L 21/02236; H01L 21/02532; H01L 21/02603; H01L 21/28255; H01L 21/31111; H01L 29/0653; H01L 29/0673; H01L 29/42392; H01L 29/66439; H01L 29/775; H01L 29/78684; H01L 29/78696
USPC .......................................................... 438/151
See application file for complete search history.

(56) References Cited

U.S. PATENT DOCUMENTS 8,872,161 B1 * 10/2014 Ching ................. H01L 29/0673
257/24
10,170,636 B2 * 1/2019 Chang ............... H01L 29/78696
(Continued)

OTHER PUBLICATIONS

European Search Report, European Patent Application No. 17179667. 5, dated Dec. 13, 2017, 10 pages.

*Primary Examiner* — Didarul A Mazumder
(74) *Attorney, Agent, or Firm* — McDonnell Boehnen Hulbert & Berghoff LLP (57) ABSTRACT

Example embodiments relate to germanium nanowire fabrication. One embodiment includes a method of forming a semiconductor device that includes at least one Ge nanowire. The method includes providing a semiconductor structure that includes at least one, the at least one fin including a stack of at least one Ge layer alternative with SiGe layers. The method also includes at least partially oxidizing the SiGe layer into $SiGeO_x$. Further, the method includes capping the fin with a dielectric material. In addition, the method includes annealing. Still further, the method includes selectively removing the dielectric material and the $SiGeO_x$.

13 Claims, 4 Drawing Sheets

(51) Int. Cl.
*H01L 29/423* (2006.01)
*H01L 29/66* (2006.01)
*H01L 29/06* (2006.01)
*H01L 29/775* (2006.01)
*H01L 21/311* (2006.01)
*H01L 29/786* (2006.01)

(56) References Cited

U.S. PATENT DOCUMENTS

| | | | |
|---|---|---|---|
| 2005/0266645 A1* | 12/2005 | Park | H01L 29/1033 438/282 |
| 2008/0135949 A1* | 6/2008 | Lo | B82Y 10/00 257/401 |
| 2009/0085119 A1* | 4/2009 | Ernst | H01L 29/66439 257/365 |
| 2009/0090934 A1* | 4/2009 | Tezuka | H01L 27/1211 257/190 |
| 2010/0187503 A1* | 7/2010 | Moriyama | B82Y 10/00 257/24 |
| 2011/0070734 A1* | 3/2011 | Saracco | B82Y 10/00 438/689 |
| 2013/0302955 A1* | 11/2013 | Vinet | H01L 29/1033 438/197 |
| 2014/0273423 A1* | 9/2014 | Fronheiser | H01L 29/42392 438/585 |
| 2015/0021697 A1 | 1/2015 | Colinge et al. | |
| 2015/0228652 A1 | 8/2015 | Cheng et al. | |
| 2016/0118304 A1* | 4/2016 | Zang | H01L 29/78696 438/694 |
| 2017/0005195 A1 | 1/2017 | Ching et al. | |
| 2017/0047452 A1 | 2/2017 | Kim et al. | |
| 2017/0140996 A1* | 5/2017 | Lin | H01L 29/42392 |
| 2017/0154973 A1* | 6/2017 | Ching | H01L 29/41791 |

* cited by examiner

METHOD OF FORMING A SEMICONDUCTOR DEVICE COMPRISING AT LEAST ONE GERMANIUM NANOWIRE

CROSS-REFERENCE TO RELATED APPLICATIONS

The present application is a non-provisional patent application claiming priority to European Patent Application No. EP 17179667.5, filed Jul. 4, 2017, the contents of which are hereby incorporated by reference.

FIELD OF THE DISCLOSURE

The description relates to the field of nanowire semiconductor devices. More specifically, it relates to a method for forming germanium nanowires from a stack of alternating germanium (Ge)/silicon germanium (SiGe) layers.

BACKGROUND

Horizontal germanium gate all around devices are typically made on Ge single wires. These Ge single wires may for example be made starting from Ge on insulator substrate followed by substrate undercutting or starting from Ge on Si followed by substrate undercutting. Using such a method it is not possible to obtain a semiconductor device including a plurality of vertically-stacked horizontal Ge nanowires.

In order to fabricate vertically stacked horizontal Ge gate all around devices (GAA) from an alternating stack of Ge/SiGe, etching of SiGe selective to relaxed or strained Ge may be used.

At the moment, there is no conventional solution, dry or wet, to release Ge wires from a SiGe/Ge multistack layer with a good selectivity of SiGe versus Ge. As a result, sacrificial Ge has to be taken into account, which subsequently puts limitations on its use as densely stacked Ge wires in future technology nodes.

In alternate techniques, a wet etch may be used to remove the SiGe. The wet etchant may for example be tetramethylammonium hydroxide (TMAH). However, it is difficult to remove SiGe selectively to Ge by wet etching. Selectivity of conventional wet etch approaches is currently limited to about 15:1 at best, which is considered insufficient to provide Ge wires having dimensions compatible with expected density rules for target device nodes.

SUMMARY

Embodiments herein provide a method for forming a semiconductor device including at least one horizontal Ge nanowire.

Example embodiments may include methods and devices, for example.

Embodiments relate to a method of forming a semiconductor device including at least one Ge nanowire, the method including providing a semiconductor structure including at least one fin, the at least one fin including a stack of at least one Ge layer alternated with SiGe layers; at least partially oxidizing the SiGe into $SiGeO_x$; capping the fin with dielectric material; annealing (140); selectively removing the dielectric material and the $SiGeO_x$.

Some embodiments allow the formation of a semiconductor device that includes at least one Ge nanowire starting from a stack of alternating Ge/SiGe layers. This may allow the fabrication of multistack Ge gate all around devices. In some embodiments, during the anneal step, $GeO_x$ will convert into $SiGeO_x$, resulting in preferential oxidation of SiGe. Thus for the removal of SiGe versus Ge, a selectivity of higher than 15 to 1, or even higher than 30 to 1, or even higher than 50 to 1 can be obtained.

In some embodiments, the method includes repeating the steps of oxidizing, capping, annealing, and removing.

In some embodiments, steps of oxidizing, capping, annealing, and removing may be repeated as this allows a significant reduction of the SiGe size with an increased selectivity towards Ge.

In some embodiments, the method includes removing the dielectric material and the $SiGeO_x$ using wet etching.

In some embodiments, the method includes removing the dielectric material and the $SiGeO_x$ is performed using HF as etchant.

In some embodiments, the temperature during oxidizing is below 450° C.

In some embodiments, keeping the temperature below 450° C. may have at least three benefits: (1) not to sublime Ge oxide, (2) to avoid intermixing of SiGe and Ge, and (3) not to relax Ge because the Ge nanowires will be the channel layer, therefore they may be kept strained.

In some embodiments, the temperature during annealing is above 500° C.

In some embodiments, the temperature can be increased above 500° C. during the anneal step as this will result in a better conversion of $GeO_x$ into $SiGeO_x$. This is possible because a capping layer is applied, which prevents the sublimation of Ge.

In some embodiments, the at least one fin of the provided semiconductor structure is formed on a Ge substrate.

In some embodiments, the at least one fin of the provided semiconductor structure is formed on a SiGe substrate.

In some embodiments, compressive strain comes in the Ge wires since the stack is grown lattice matched to the substrate. This compressive strain boosts the PMOS performance.

In some embodiments, the at least one fin of the provided semiconductor structure is formed on a strain-relaxed buffer.

In some embodiments, a strain-relaxed buffer layer may be fully relaxed and have a low defect density. In some embodiments, the strain-relaxed buffer may be grown on top of a Si substrate. When targeting relaxed Ge wires, a Ge strain-relaxed buffer may be used. When targeting strained Ge wires, a SiGe strain-relaxed substrate may be used.

In some embodiments, a virtual substrate may be used. A virtual substrate meaning that a strain-relaxed buffer is grown on top of another substrate (e.g. a silicon substrate).

In case a Ge virtual substrate is used, compressive strain in the Ge wire to boost PMOS performance may come from another source than the substrate e.g. by using a GeSn source/drain stressor.

In some embodiments, the dielectric material for capping the fin is $SiO_2$.

In some embodiments, $SiO_2$ can be easily removed using a wet etchant.

In some embodiments, the method includes oxidizing, capping, annealing, selectively removing the dielectric material and the $SiGeO_x$ until release of the at least one Ge layer to obtain the at least one Ge nanowire.

In some embodiments, the method includes selectively removing remaining SiGe until release of the at least one Ge layer to obtain the at least one Ge nanowire.

In some embodiments, any remaining SiGe is selectively removed. In some embodiments, this may be achieved using standard etchants such as TMAH and standard etching methods can be used to remove any remaining SiGe.

Because of the oxidation/anneal/removal treatments, the final step using standard etching methods can be significantly reduced in time, resulting in an overall significantly improved selectivity towards Ge.

In some embodiments, the method includes applying a gate stack around the nanowires.

Particular aspects are set out in the accompanying independent and dependent claims. Features from the dependent claims may be combined with features of the independent claims and with features of other dependent claims as appropriate and not merely as explicitly set out in the claims.

These and other aspects will be apparent from and elucidated with reference to the embodiment(s) described hereinafter.

Any reference signs in the claims shall not be construed as limiting the scope. In the different drawings, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

The terms top, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present embodiment, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed invention requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

Where in embodiments reference is made to a Ge layer or a Ge nanowire the germanium content of the layer or nanowire may for example be at least 90%.

Where in embodiments reference is made to a SiGe layer, the ratio between the amount of Ge and the amount of Si may for example vary between 1 and 8 or even between 0.5 and 9.

Embodiments relate to a method for forming a horizontal nanowire device including at least one Ge nanowire such as for example at least one horizontal Ge nanowire from a fin including a stack of alternating SiGe/Ge layers. In these embodiments SiGe is removed by sacrificial oxidation of SiGe into a silicon germanium oxide ($SiGeO_x$), followed by a cap deposition and subsequent annealing to convert any $GeO_x$ formed into $SiGeO_x$.

Figure 1:
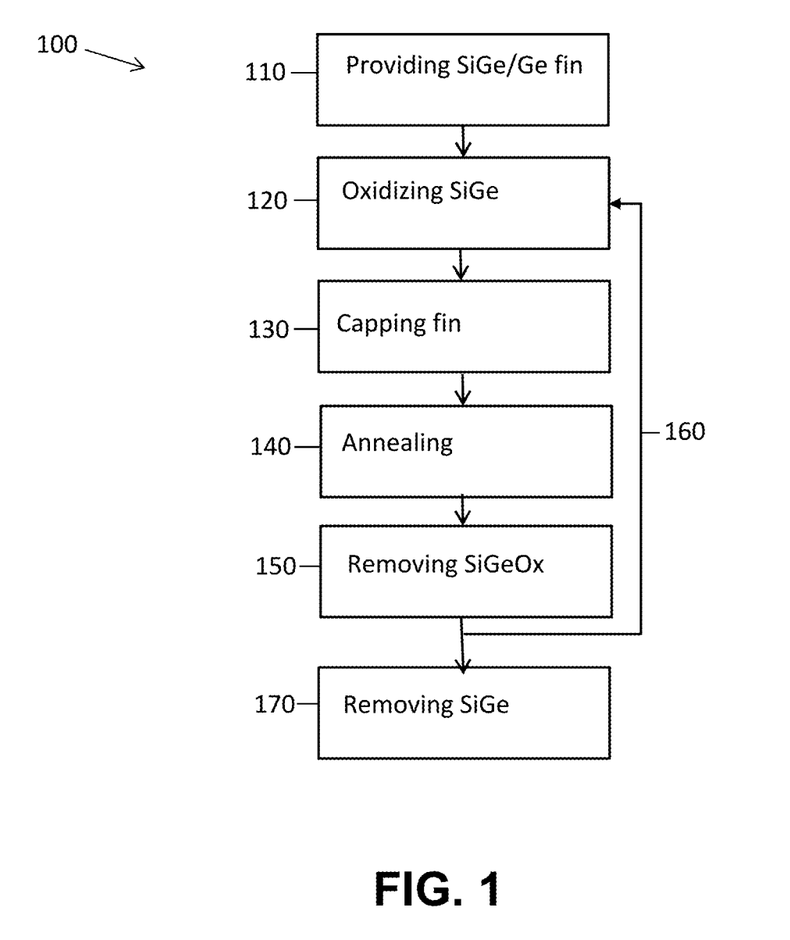
FIG. 1 shows a flow chart of a method, according to example embodiments.
Figure 2A:
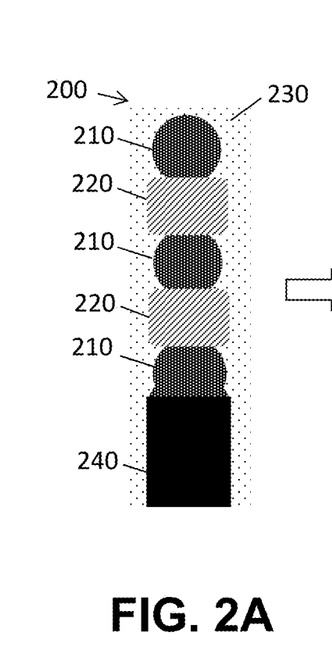
FIG. 2A shows a schematic drawing of the cross-section of a fin after an anneal step for one iteration of a method, according to example embodiments.
Figure 2B:
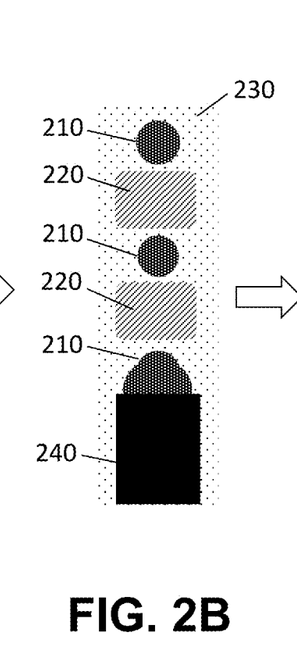
FIG. 2B shows a schematic drawing of the cross-section of a fin after an anneal step for one iteration of a method, according to example embodiments.
Figure 2C:
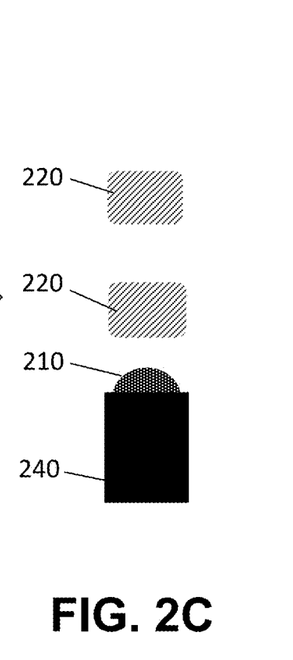
FIG. 2C shows a schematic drawing of the cross-section of a fin after an anneal step for one iteration of a method, according to example embodiments.

FIG. 1 shows a flow chart of different method steps of an example embodiment of a method in accordance with embodiments. Schematic drawings of stacks obtained while executing these different steps are shown in FIGS. 2A-2C.

Figure 3:
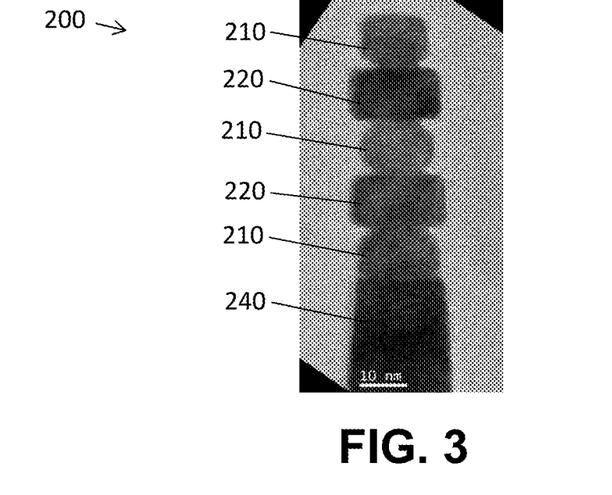
FIG. 3 shows a TEM image of a fin obtained after oxidizing, capping, and annealing the fin, according to example embodiments.
Figure 4:
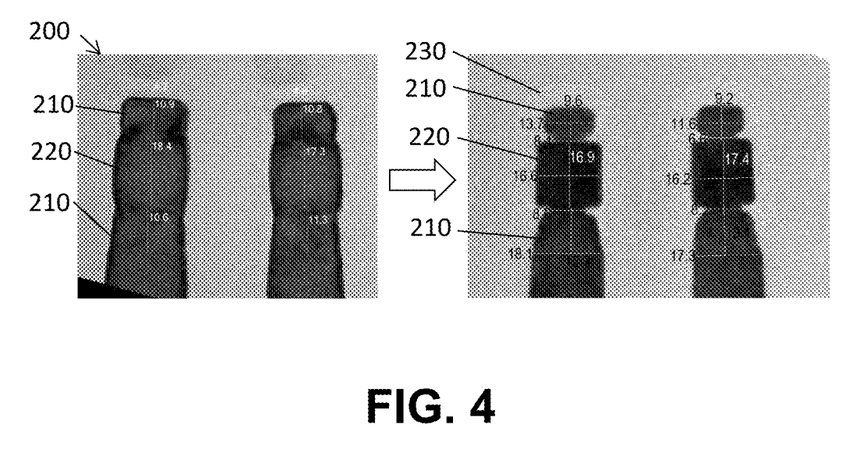
FIG. 4 shows, at the left side, a TEM image of two fins, each including a stack of SiGe50%/Ge/SiGe50%, and, at the right side, the resulting stacks after oxidation, capping, and annealing, according to example embodiments.
Figure 5:
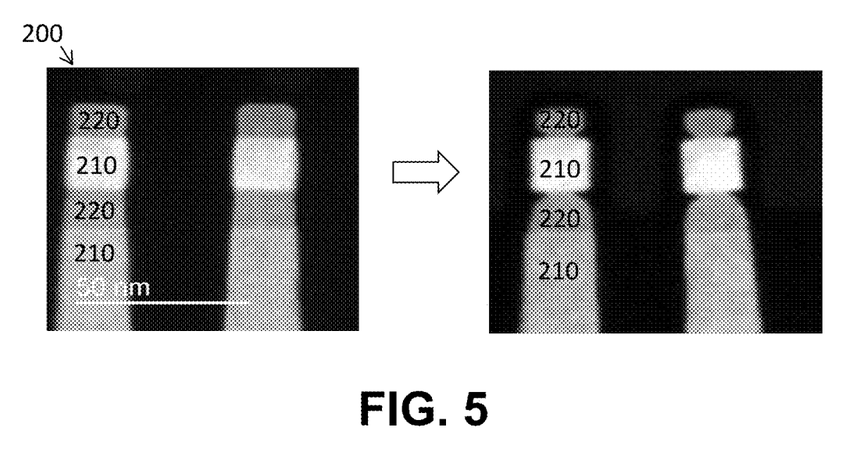
FIG. 5 shows, at the left side, a TEM image of two fins including an alternating stack of SiGe/Ge, and, at the right side, the resulting stacks after oxidation, capping, and annealing, according to example embodiments.

FIG. 3, FIG. 4, and FIG. 5 show TEM images of Ge/SiGe stacks obtained during method steps in accordance with embodiments.

The method may include providing 110 a semiconductor structure including at least one fin 200. The at least one fin may include a stack of at least one Ge layer 220 alternated with SiGe layers 210. The Ge may be relaxed or strained Ge.

The method moreover includes at least partially oxidizing 120 the SiGe 210 into $SiGeO_x$. In some embodiments, the SiGe oxidizes at a higher rate than the Ge. The temperature of the oxidation may be less than 450° C. or even less than 400° C. This is to prevent sublimation of the Ge. In some embodiments, below these temperatures, intermixing of SiGe and relaxation of Ge may be avoided.

The method moreover includes capping 130 the fin 200 with dielectric material 230. The dielectric material may be easily removable, able to protect the Ge and $GeO_2$ from sublimation and noble against oxidation especially during the anneal step, which is done after the capping step. In embodiments, the capping is done all around the fin. After capping, both the top of the fin and the sidewalls of the fin are covered with the dielectric material.

The applied layer of dielectric material should be non-porous for $GeO_x$ gasses. Such an applied layer may prevent the $GeO_x$ from getting lost in the environment after sublimation during a following anneal step. The applied layer of dielectric material allows to increase the anneal temperature during the following anneal step. The oxide may be $SiO_2$. Other dielectric materials may also be used. The dielectric should be thick enough such that it is non-porous for $GeO_x$ and it should be easily removable (e.g. by wet etching). In case of an $SiO_2$ capping layer, the $SiO_2$ capping layer may for example have a thickness between 1 and 10 nm. A capping layer may include SiON, SiN, or $Al_2O_3$.

The method moreover includes an anneal step 140. The anneal step may further enhance the oxidation of the SiGe. The oxygen of the $GeO_x$ is used for the further oxidation of SiGe. In some embodiments, the $GeO_x$ may not get lost by sublimation. In case the capping layer includes aSi or polySi, the cap may contribute to the conversion of $GeO_x$ into $SiGeO_x$. The temperature of the anneal step may be above 500° C. or even above 550° C. The upper limit for the annealing may be set by the requirement not to create relaxation defects in the stack because of the lattice mismatch between Ge and SiGe. It is therefore understood that the maximum temperature is linked to the Ge concentration used in SiGe. The lower the Ge concentration, the larger the lattice mismatch with Ge and therefore also the lower the anneal temperature before relaxation occurs. Relaxation has for example been observed for a stack of SiGe 50% and Ge. Besides relaxation of SiGe and Ge, the intermixing of SiGe and Ge may put an upper limit on the annealing temperature depending on which causes issues earlier. For a SiGe/Si stack annealing some limited intermixing has been found during annealing at 750° C. As the diffusion coefficients go up with Ge %, intermixing may occur at lower temperatures. Intermixing may for example limit the maximum annealing temperature at 700° C. or even lower.

The anneal step 140 is followed by selectively removing 150 the dielectric material and the $SiGeO_x$. In some embodiments, the $SiGeO_x$ may be a low-quality oxide that can be easily removed. Therefore the $SiGeO_x$ can be removed at a higher rate than the Ge. This may for example be done using wet selective etching. This may for example be achieved in an HF solution. Thereby the size of the SiGe layer is decreased. After these method steps at least part of the SiGe layers is removed while limited amount of the Ge layer is removed.

The dielectric material and the $SiGeO_x$ do not necessarily need to be removed together. Two chemistries may be used, one to remove the dielectric and one to remove the $SiGeO_x$. These removal steps may follow directly after each other. This is, however, not strictly required. In other embodiments, dielectric material and the $SiGeO_x$ may be removed together using the same chemistry.

In some embodiments, the oxidizing step 120 is followed by the capping step 130, which is followed by the anneal step 140. Methods according to embodiments may include a plurality of iterations of oxidizing 120, capping 130, annealing 140, and removing 150. In some embodiments, only part of the SiGe may be oxidized in one iteration. The remaining SiGe may be removed in subsequent iterations. Thereby the size of the SiGe layer is decreased after every iteration.

In some embodiments, the SiGe may be removed in iterations where part of the SiGe is oxidized, followed by capping the stack and annealing, and followed by removal of the formed $SiGeO_x$. While it might be possible to fully form Ge nanowires by fully converting the sacrificial SiGe layer in the SiGe/Ge/SiGe/Ge/SiGe multistack into $SiGeO_x$ and removing it by an HF solution, implementing iterations of the selective oxidation approach followed by capping, annealing, and selectively removing the oxidized part may lead to a SiGe removal process with a higher selectivity. In some embodiments, the iterations may be followed by a final selective removal 170 of SiGe for the final removal of the last part of SiGe as this leads to a total selective SiGe removal process. The selective removal may be a short selective etch of SiGe towards Ge. For this etching a standard selective etch method may be applied. Having a better selectivity may allow for better control of the losses and final Ge channel dimensions. Ultimately, this reduced Ge loss can also allow for more dense stacking and/or more Ge wires on top of each other. By increasing the selectivity, an improved process window for the multistack wire release process can be obtained.

By iterating more than once it can be avoided that the SiGe oxidizes into $SiGeO_x$ with a core of Ge in the middle. Iterating more than once may reduce the size of the SiGe, which may shorten the final selective etch step used to remove remaining SiGe selective to Ge. Multiple iterations may, however, result in an increase of Ge content in the remaining SiGe (Ge condensation) which could make the final selective etch step more difficult (and longer). In some embodiments, an optimum may be found experimentally between size reduction and Ge enrichment. This optimum could depend on the initial concentration and oxidation methods used.

In some embodiments, the step of selectively removing the steps of oxidizing 120, capping 130, annealing 140 and selectively removing 150 the dielectric material and the $SiGeO_x$ may be repeated until release of the at least one Ge layer 220 to obtain the at least one Ge nanowire.

FIG. 2A shows a schematic drawing of the cross-section of a fin 200 after an anneal step 140 of a first iteration in accordance with some embodiments. It shows a stack of Ge layers 220 alternated with SiGe layers 210 the stack is built on a substrate 240. This may be a Ge substrate. A dielectric material 230 is present as a cap over the fin 200. As can be seen from this figure the SiGe layer 210 is oxidized more than the Ge layer 220. FIG. 2B shows the fin after annealing in the second iteration. In this fin the size of the SiGe layers has decreased even more. FIG. 2C shows the cross-section of the fin after the last iteration including a final selective etch step 170 that removes SiGe selectively to Ge. The SiGe layers 210 have been completely removed (except for the SiGe layer on the Ge substrate) and only the Ge nanowires are remaining. The number of iterations of oxidation/anneal/cap etch shown in this figure is two, followed by a selective etch. Embodiments described herein, however, are not limited thereto. More or less iterations may be applied. For each iteration the oxidation and anneal conditions (e.g. temperature, duration) may be modified.

FIG. 3 shows a TEM image of a fin 200 obtained after oxidizing, capping and annealing the fin in accordance with some embodiments. This fin corresponds with the fin in the schematic drawing in FIG. 2A. In this example the fin is capped 130 with a 5 nm thick $SiO_2$ layer. For the anneal step a temperature of 520° C. was applied. In this example the width of the SiGe layers is reduced to 12.7 for the top, 13.6 for the middle and 15.8 nm for the bottom SiGe layer 210 whereas the width of the Ge layers remained at 17.5 and 17.9 nm respectively. At the interface between the SiGe and the Ge layers $SiGeO_x$ was formed with a thickness of 5 nm at each side whereas the dimensions of the Ge layers remained unchanged.

These numbers are only illustrative, but they indicate the selectivity of the method in accordance with some embodiments. The width of the provided 110 fin, and hence the starting width of the Ge and SiGe layers may for example be between 8 and 15 nm or even between 5 and 25 nm. The width of the Ge layers in the fin when providing the semiconductor structure may for example be 15 nm. After removing the SiGe layers, using a method according to some embodiments, the resulting width of the Ge nanowires may, for example, still be larger than 6 or even larger than 10 or even be 15 nm.

In some embodiments, the width of the Ge nanowire may for example only reduce width 50% or even only width 10% after complete removal of the SiGe layers in between the Ge nanowires. The number of resulting Ge nanowires may for example be between 1 and 5.

This and the following figure illustrate an enhanced oxidation of SiGe in a multistack of SiGe/Ge when combining oxidation, capping, and annealing in accordance with some embodiments.

FIG. 4 shows at the left side a TEM image of two fins each including a stack of SiGe50%/Ge/SiGe50%, and at the right side the resulting stacks after oxidation, capping, and annealing. Also here the enhanced oxidation of SiGe compared to Ge is illustrated. At the interface between the SiGe layers and the Ge layer $SiGeO_x$ was formed with a thickness of 4 nm at each side whereas the dimensions of the Ge layers remained unchanged. The width of the top SiGe layer 210 reduced to around 12 nm (13.7 nm for the left fin, 11.6 nm for the right fin) whereas the width of the Ge layer 220 remained around 16 nm (16.6 nm for the left fin, 16.2 nm for the right fin).

FIG. 5 shows at the left side a TEM image of two fins including an alternating stack of SiGe 210/Ge 220, and at the right side the resulting stacks after oxidation, capping, and annealing in accordance with some embodiments.

Figure 6:
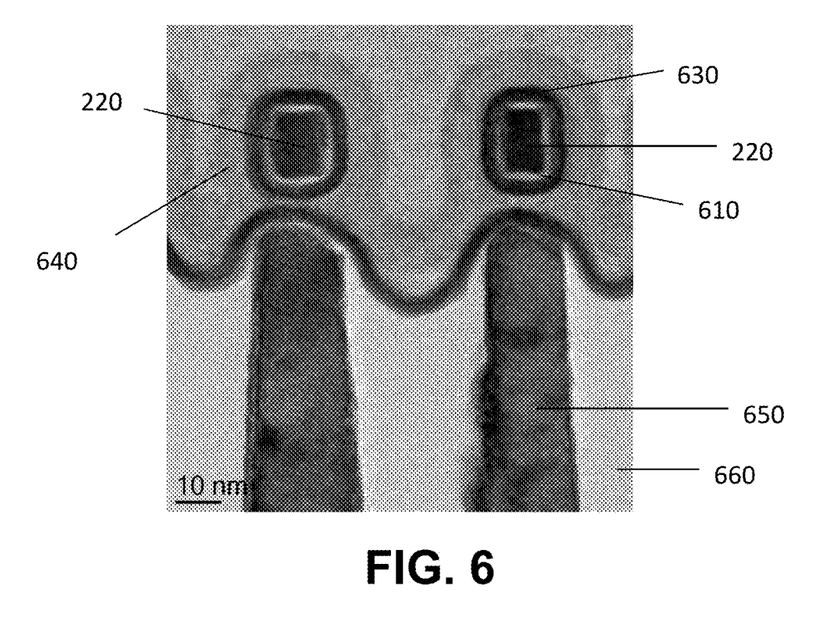
FIG. 6 shows a TEM image of a Ge nanowire obtained using a method, according to example embodiments.

FIG. 6 shows a TEM image of Ge nanowires 220 obtained using a method in accordance with some embodiments. In this example, one iteration of oxidation is applied. Around the nanowire an oxidized Si cap 610 is present (this is the white part around the nanowire). Around the oxidized Si cap 610, a $HFO_2$ layer 630 is present. A metal gate 640 is surrounding the Ge nanowires 220 with in between the gate 640 and the Ge nanowires 220 the oxidized Si cap 610 and the $HFO_2$ layer 630. The figure also shows the Ge fins 650 and the shallow trench isolation (STI) 660. This figure is only provided as an example and is non-limiting.

In some embodiments, the step of selectively removing the dielectric material and the $SiGeO_x$ may be followed by a step of selectively etching remaining SiGe such that at least one Ge nanowire is obtained. This may be done after the first iteration or after a few iterations.

In some embodiments, the method may include a step wherein a gate stack is applied around the nanowires.

In summary, embodiments described herein allow the process window to be opened by combining the etching with oxidation. This is achieved by at least partially oxidizing the layers of the SiGe—Ge stack, by putting a capping layer around it, followed by an anneal step. This sequence of oxidizing, capping, and anneal may dominantly oxidize the SiGe. By the oxidation step both the SiGe and the Ge are oxidized. As $SiGeO_x$ is more stable than $GeO_x$, the anneal step results in an increase of $SiGeO_x$ and a decrease of $GeO_x$ after the anneal step. By putting the capping layer, it is avoided that the $GeO_x$ would evaporate which would eventually result in a thinner Ge nanowire. Moreover the oxide would be lost which is used to oxidize SiGe during the anneal step.

What is claimed is:

1. A method of forming a semiconductor device comprising at least one Ge nanowire, the method comprising steps:
   providing a semiconductor structure comprising at least one fin, the at least one fin comprising a stack of at least one Ge layer alternated with SiGe layers;
   at least partially oxidizing the SiGe layers into SiGeOx;
   capping the at least one fin with a dielectric material;
   annealing the semiconductor structure; and
   selectively removing the dielectric material and the $SiGeO_x$.

2. The method according to claim 1, further comprising repeating the steps of at least partially oxidizing, capping, annealing, and selectively removing.

3. The method according to claim 1, wherein selectively removing the dielectric material and the $SiGeO_x$ comprises wet etching.

4. The method according to claim 3, wherein HF is used as an etchant in the wet etching.

5. The method according to claim 1, wherein a temperature during the at least partially oxidizing is below 450° C.

6. The method according to claim 1, wherein a temperature during the annealing of the semiconductor structure is above 500° C.

7. The method according to claim 1, wherein the at least one fin of the semiconductor structure is formed on a Ge substrate.

8. The method according to claim 1, wherein the at least one fin of the semiconductor structure is formed on a SiGe substrate.

9. The method according to claim 1, wherein the at least one fin of the semiconductor structure is formed on a strain-relaxed buffer.

10. The method according to claim 1, wherein the dielectric material for capping the at least one fin comprises $SiO_2$.

11. The method according to claim 1, further comprising an oxidizing, capping, annealing, and selectively removing the dielectric material and the $SiGeO_x$ until releasing of the at least one Ge layer to obtain the at least one Ge nanowire.

12. The method according to claim 1, further comprising selectively removing remaining SiGe until releasing of the at least one Ge layer to obtain the at least one Ge nanowire.

13. The method according to claim 12, further comprising applying a gate stack around the at least one Ge nanowire.

* * * * *